United States Patent
Kiefer et al.

(10) Patent No.: US 6,882,151 B2
(45) Date of Patent: Apr. 19, 2005

(54) MRT USER INTERFACE ALLOWING ACCURATE SLICE PLANNING BASED ON A DISTORTION-CONRRECTED MRT OVERVIEW IMAGE

(75) Inventors: Berthold Kiefer, Erlangen (DE); Robert Krieg, Nuernberg (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/712,438

(22) Filed: Nov. 13, 2003

(65) Prior Publication Data

US 2004/0147835 A1 Jul. 29, 2004

(30) Foreign Application Priority Data

Nov. 13, 2002 (DE) .......................... 102 52 852

(51) Int. Cl.⁷ ................................................. G01V 3/00
(52) U.S. Cl. ....................................... 324/309; 324/307
(58) Field of Search ................................. 324/309, 3–7, 324/318, 319, 322, 311

(56) References Cited

U.S. PATENT DOCUMENTS 5,510,711 A * 4/1996 Molyneaux et al. ........ 324/309
5,572,125 A * 11/1996 Dunkel ....................... 324/307

* cited by examiner

*Primary Examiner*—Brij B. Shrivastav
(74) *Attorney, Agent, or Firm*—Schiff Hardin LLP

(57) ABSTRACT

In a processing system for an MRT apparatus, a user interface as presented that permits an operator to undertake a graphical measurement planning based on already-recorded, corrected MRT overview images, the correction having been carried out by the processing system on the basis of stored data accessible by the processing system relating to non-linearities of the gradient system of the MRT apparatus being used. The processor system, in the user interface, automatically graphically demarcates the area of the corrected MRT overview image in which a positioning of additional slices to be measured will lead to a deviation of the desired slices, from the actual slices in a subsequent scan from the ear of the corrected MRT overview image in which a positioning of additional slices to be measured will not lead to such a deviation of the desired slices.

15 Claims, 3 Drawing Sheets

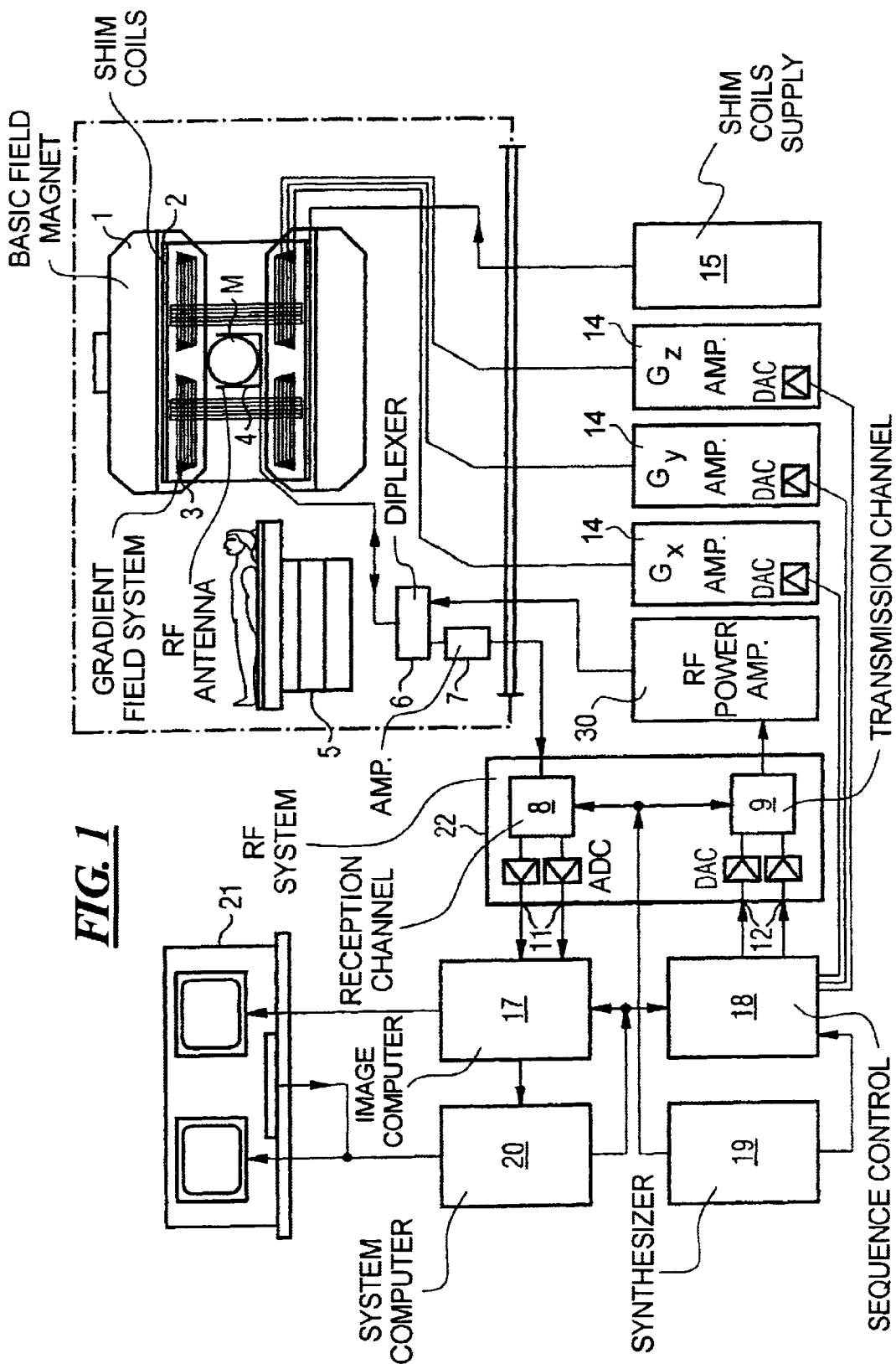

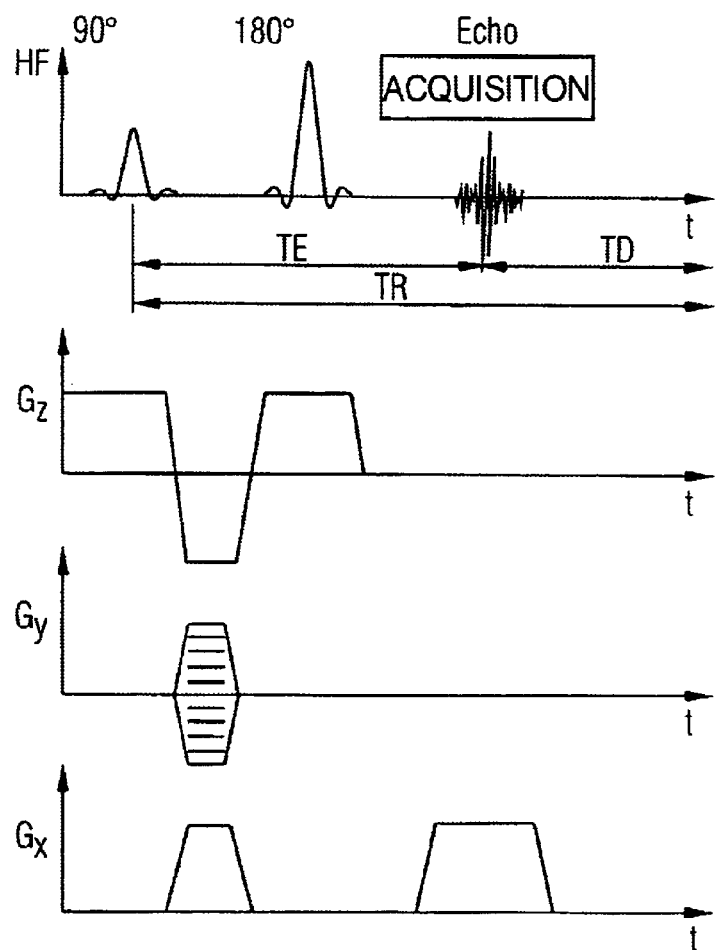
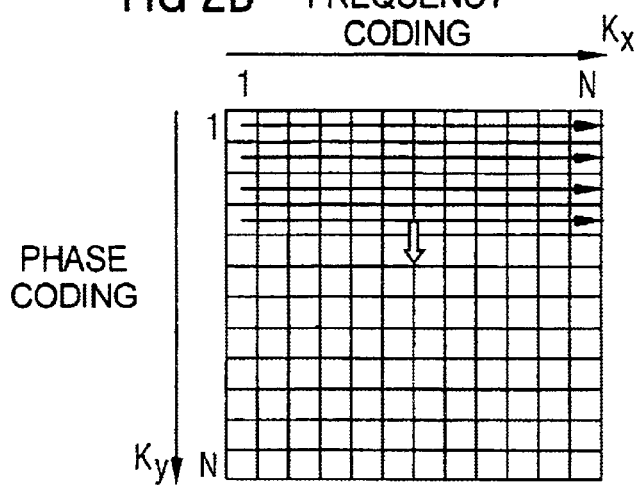

MRT USER INTERFACE ALLOWING ACCURATE SLICE PLANNING BASED ON A DISTORTION-CONRRECTED MRT OVERVIEW IMAGE

BACKGROUND OF THE INVENTION

1. Field of the Invention

The present invention relates in general to magnetic resonance tomography (MRT), as used in the field of medicine for the examination of patients. The present invention relates in particular to a user interface for the correct planning or positioning of slice packets in the spatial domain based on an already-produced, corrected (equalized) MRT overview image.

2. Description of the Prior Art

MRT is based on the physical phenomenon of nuclear spin resonance, and has been used successfully as an imaging method in medicine and in biophysics for more than 15 years. In this examination method, the subject is exposed to a strong, constant magnetic field. As a result, the nuclear spins of the atoms in the subject, which were previously oriented in a random manner, come into alignment. Radio-frequency energy can now excite these "ordered" nuclear spins to a particular resonance. This resonance produces the actual measurement signal in the MRT, which is received by means of suitable receive coils. By the use of non-homogenous magnetic fields, generated by gradient coils, the signals from the examination subject can be spatially coded in all three spatial directions; in general, this is known as "spatial coding."

The reception of the data in MRT takes place in k-space (domain frequency). The MRT image in the image domain, as it is called, is linked with the MRT data in k-space by means of a Fourier transformation. The spatial coding of the subject, which spans (fills) k-space, is accomplished by magnetic gradients in all three spatial directions. Distinctions are made between the slice selection (which defines a slice to be recorded in the subject, conventionally the z-axis), the frequency coding (defines a direction in the slice, conventionally the x-axis), and the phase coding (determines the second dimension within the slice, conventionally the y-axis).

Thus, first a slice is selectively excited, for example in the z-direction. The coding of the spatial information in the slice takes place by a combined phase and frequency coding by means of these two already-mentioned orthogonal gradient fields, which, in the example of a slice excited in the z-direction, are produced in the x-direction and y-direction by the aforementioned gradient coils.

A first possible sequence for recording the data in an MRT experiment is shown in FIGS. 2A and 2B. The sequence is a spin echo sequence. In this sequence, the magnetization of the spins is flipped into the x-y plane by a 90° excitation pulse. Over time (½ $T_E$; $T_E$ is the echo time), there occurs a dephasing of the magnetization components, which together form the transverse-magnetization in the x-y plane $M_{xy}$. After a certain time has passed (e.g., ½ $T_E$), a 180° pulse is emitted in the x-y plane in such a way that the dephased magnetization components are mirrored without modifying the direction of precession and speed of precession of the individual magnetization components. After a further time span ½ $T_E$, the magnetization components again point in the same direction, i,e., there is a regeneration of the cross-transverse, designated a "rephasing." The complete regeneration of the cross-transverse is designated the spin echo.

In order to measure a complete slice of the subject to be examined, the imaging sequence is repeated N times for different values of the phase coding gradient e.g. $G^y$, and in each iteration of the sequence the frequency of the magnetic resonance signal (spin echo signal) is sampled, digitized, and stored by the $\Delta t$-clocked ADC (analog-digital converter) N times at equidistant time intervals $\Delta t$, in the presence of the read-out gradient $G^x$. In this way, a numerical matrix as shown in FIG. 2B is obtained, produced row-by-row and having N×N data points. A symmetrical matrix having N×N points is only one example; asymmetrical matrices, or other k-space occupations, can also be produced. From such data sets in k-space, Fourier transformation is used to immediately reconstruct MR images of the relevant slice, having a resolution of N×N pixels, The readout must be concluded in a time interval that corresponds to the decay of the transverse-magnetization. Otherwise, for example in a single-shot EPI sequence, the various rows of the k-matrix would be differently weighted in a manner dependent on the sequence in which they were acquired, certain spatial frequencies would be overemphasized, while others would be underemphasized. High measurement speeds, however, place extremely high demands on the gradient system. In practice, gradient amplitudes of approximately 25 mT/m are used. In particular for the change of polarity of the gradient field, significant energies must be converted in a very short span of time; the switching times are, for example, approximately 0.3 ms. The time in which the maximum gradient amplitude can be reached is known in general as the slew rate. The slew rate is, practically speaking, the speed with which a gradient field can be activated. Older systems have, or had, slew rates of 20–40 mT/ms. Modem systems have slew rates of 100–200 mT/ms, with the result that in modern systems, due to the gradient coil inductance, the respective gradient field has strong non-linearities.

In general, non-linearities of the gradient fields cause a distortion of the reconstructed MRT images, which undesirable in most cases. In modem MRT systems, such distortions can be corrected in the display of the image. The correction primarily serves cosmetic purposes, and does not increase the precision of the diagnostic findings. Most MR technicians, however, prefer to implement or activate this distortion correction, in particular if the obtained MRT images are to be forwarded to other specialist physicians, who may not be familiar with the details of MRT because such persons otherwise may consider the non-corrected images to be sub-par.

If the operator/technician now wishes to plan further measurements based on such a corrected image by the positioning of additional slice packets, a conflict arises because the planned slice packets, at their planned spatial position, do not actually "see" non-linear gradient fields, and thus the image plane that is planned based on the corrected image does not correspond to the actually recorded image plane.

Non-linearity and slew rate are directly connected with one another. Thus, for example there are MRT systems with a gradient system that can easily (for user-related reasons) be operated in two states (modes). The gradient system is constructed such that in a first operating mode (mode 1), a large but not strong gradient field can be produced with a relatively slow, moderate slew rate. Such a gradient field is as a rule very linear. In a second operating state (mode 2), however, a relatively small but strong gradient field can be produced with a rapid slew rate. As a rule, the gradient field produced in this way strongly non-linear.

If in mode 1 a first slice packet is recorded as an overview image, on the basis of which data acquisition (scans for scanned) further slices are then planned, but which are to be recorded in mode 2, a conflict as set forth above again results. The planned slice planes will not agree with the already-recorded image plane, due to the different non-linearity of the gradient fields.

SUMMARY OF THE INVENTION

An object of the present invention is to provide a processing system for an MRT apparatus that assists the operator/technician in the planning of additional MRT measurements based on MRT images that have been corrected as described above, in order to avoid conflicts of the type described above, in a simple manner.

This object is achieved according to the present invention, by a processing system for an MRT apparatus, having a device for the graphic representation of a user interface that enables graphic planning of an MRT scan based on an already-recorded, corrected MRT overview image, wherein the correction has been made by the processor system on the basis of data, stored in a storage medium accessible by the processing system, relating to non-linearities of the gradient system of the MRT apparatus being used. According to the present invention, the processing system generates the user interface with a graphical demarcation of the area of the corrected MRT overview image in which a positioning of additional slices to be measured will lead to data being acquired from actual slices that deviate from the desired (planned) slices, from the area of the corrected MRT overview image in which a positioning of additional slices to be measured will not lead to data being acquired from slices that deviate from the desired slices.

According to the present invention, the demarcation is made automatically by the processing system.

In addition, according to the present invention the above-described processing system, during the correction of the MRT overview image, also corrects planned additional slice packets to be measured in the MRT overview image, and graphically displays their orientation situation in the overview image.

In the case of transverse orientation of the additional slices to be measured relative to the orientation of the patient, the processing system according to the present invention effects a corresponding displacement of the table, via which the slice packet is moved into the isocenter of the MRT apparatus.

The non-linearities of the gradient system used by the processing system are measured once before the delivery of the MRT apparatus, and are stored in a storage medium that is accessible by the processing system.

DESCRIPTION OF THE DRAWING

FIG. 1 schematically illustrates an MRT apparatus operable in accordance with the invention.

FIG. 2A schematically shows the chronological curve of the RF and gradient pulses of a spin echo sequence.

FIG. 2B schematically shows the chronological scanning of the k-space matrix in a spin echo sequence.

DESCRIPTION OF THE PREFERRED EMBODIMENTS

Figure 3A:
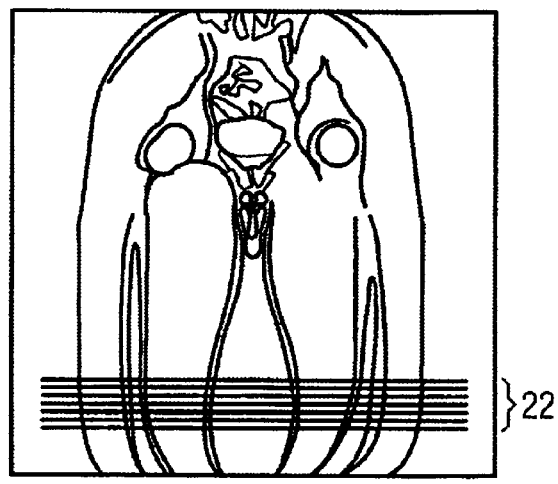
FIG. 3A schematically shows an uncorrected distorted MRT image in which a slice packet is identified for further measurement.

FIG. 1 is a schematic illustration of an MRT apparatus for conduct MR scans according to the present invention. The basic design of the MRT apparatus corresponds to that of a conventional tomography apparatus, with the differences described below. A basic field magnet 1 generates a strong, chronologically constant magnetic field for the polarization or orientation of the nuclear spins in the region to be examined of a subject, such as for example a part that is to be examined of a human body. The high degree of homogeneity of the basic magnetic field required for the magnetic resonance measurement is defined in a spherical measurement volume M into which the parts of the human body that are to be examined are introduced. In order to support the homogeneity requirements, and in particular in order to eliminate chronologically invariable influences, shim plates, made of a ferromagnetic material, are attached at suitable locations. Chronologically variable influences are eliminated by shim coils 2 that are driven by a shim current supply 15, In basic field magnet 1, there is situated a cylindrical gradient coil system 3 that is composed of three coils or windings. The coils are supplied with current by respective amplifier 14, in order to produce linear gradient fields in the respective directions of the Cartesian coordinate system. The first coil of the gradient field system 3 produces a gradient $G_x$ in the x-direction, the second coil produces a gradient $G_y$ in the y-direction, and the third coil produces a gradient $G_z$ in the z-direction. Each amplifier 14 has a digital-analog converter that is driven by a sequence control unit 18 in order to produce gradient pulses at the correct times.

Inside the gradient field system 3 there is situated a radio-frequency antenna 4 that converts the radio-frequency pulses emitted by a radio-frequency power amplifier 30 into a magnetic alternating field in order to excite the nuclei and to orient the nuclear spins of the subject to be examined, or of the region to be examined. The radio-frequency antenna 4 also converts the alternating field emanating from the precessing nuclear spins (as a rule, the nuclear spin echo signals caused by a pulse sequence composed of one or more radio-frequency pulses and one or more gradient pulses), into a voltage that is supplied via an amplifier 7 to a radio-frequency receive channel 8 of a radio-frequency system 22. The radio-frequency system 22 additionally has a transmission channel 9 in which the radio-frequency pulses are generated for the excitation of the magnetic resonance. The respective radio-frequency pulses are represented digitally in the sequence control unit 18 as a sequence of complex numbers, on the basis of a pulse sequence that is predetermined by system computer 20. This sequence of numbers is supplied as a real part and an imaginary part via a respective input 12 to a digital-analog converter (DAC) in the radio-frequency system 22, and from there is supplied to a transmission channel 9. In transmission channel 9, the pulse sequences are modulated onto a radio-frequency carrier signal having a base frequency that corresponds to the resonance frequency of the nuclear spins in the measurement volume.

The changeover from transmission to reception operation takes place via a diplexer switch 6. The radio-frequency antenna 4 emits the radio-frequency pulses for the excitation of the nuclear spins into the measurement volume M, and samples the resulting echo signals. The obtained magnetic resonance signals are demodulated in a phase-sensitive manner in a reception channel 8 of the radio-frequency system 22, and are converted into a he real part and an imaginary part of the measurement signal via respective analog-digital converters (ADC). Using an image computer 17, an image is reconstructed from the measurement data obtained in this way. The management of the measurement data, the image data, and the control programs are undertaken by the system computer 20. On the basis of an entered setting, the sequence control unit 18 uses control programs to control the generation of the desired pulse sequences and the corresponding scanning of k-space. In particular, the sequence control unit 18 controls the switching of the gradients at the correct time, the transmission of the radio-frequency pulses with a defined phase and amplitude, and the reception of the magnetic resonance signals. The time base (clock) for the radio-frequency system 22 and sequence control unit 18 is provided by a synthesizer 19. The selection of corresponding control programs for the generation of an MR image, as well as the display of the generated image, take place via a terminal 21 (console) that has a keyboard as well as one or more display screens.

As already mentioned, the measured MRT images, which are displayed on the screen of terminal 21, are distorted due to non-linearities of the gradient fields, in particular in modem MRT apparatuses having a high slew rate, This distortion can be corrected in a known manner using suitable image processing software implemented on the system computer 20 or in the sequence control unit 18. The basis for such corrective programs a precise knowledge of the non-linearities, obtained by a precise measurement of the gradient fields, that conventionally is made once before delivery of the respective MRT apparatus and is stored in a storage medium accessible by the system computer 20.

As explained above, the positioning of additional slices based on MRT images that have been corrected in this way results in significant conflicts, and hinders or significantly limits the operator in further measurement planning. For this reason, in MRT apparatuses of different manufacturers a slice planning or positioning based on corrected images is in general not permitted, which has led to some customer complaints. There are also manufacturers who do allow scan planning by the operator based on equalized images, but according to customer reports, it may occur that an area to be examined in the respective planned slice is in fact not correctly targeted.

The present invention is based in part on making a decision at the software level, via a user interface that is inventively visualized on the monitor of terminal 21, as to whether the positioning of additional slices carried out by the user is to take place based on a corrected or on a non-corrected image. The user interface is then modified correspondingly. The present invention also is based on avoiding a conflict as described above by the user interface either indicating to the user in a suitable fashion that the planned positioning may be subject to errors, or automatically correcting the planned slice packets to eliminate the errors. This is illustrated below on the basis of FIGS. 3A to 3C.

Figure 3B:
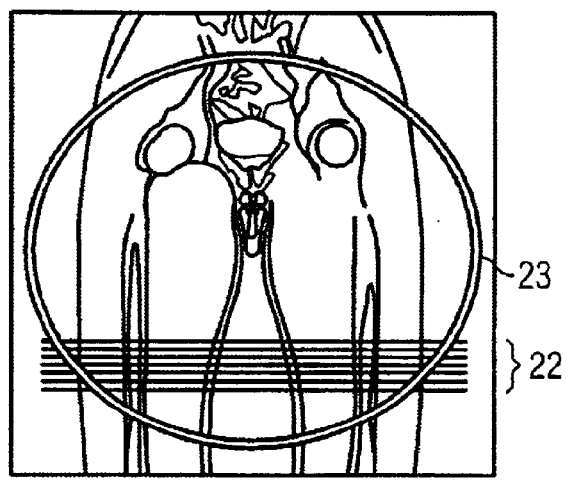
FIG. 3B schematically shows a corrected, equalized MRT image, in which, in accordance with the invention, in addition to the slice packet for further measurements, an area (isocenter) is identified that is error-free with respect to positioning.
Figure 3C:
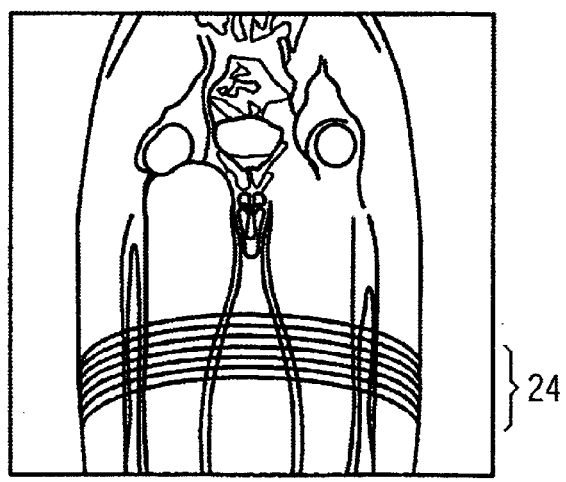
FIG. 3C schematically shows a corrected MRT image with a slice packet for planned further measurements, which also has been correspondingly corrected, in accordance with the invention.

According to the present invention, the user is permitted to position additional slice packets to be measured based on already-equalized corrected MRT images. The user is then be informed by the user interface that the planned positioning may have errors. For example, FIG. 3A shows an uncorrected MRT exposure of the iliac region up to the femurs, having clear distortions at the upper and lower edges of the image. The planning of an additional slice packet 22 to be measured in this distorted exposure can result in the planned slices not being correctly targeted in reality. In such an exposure, in which the distorted, error producing area can clearly be seen, the user will voluntarily refrain from carrying out additional measurements in the distorted area. This is not the case for corrected images, as shown for example in FIG. 3B. Here, the user interface must inform the user in which region there is agreement of the planned slices with the slices that will be actually measured. According to the present invention, this takes place by marking the distortion-free area, or the area in which the distortion can be tolerated by the user, with, for example, a circle 23 or some other geometrical shape (e.g., ellipse, rectangle, polygon, etc.). According to the present invention, the area in which the distortions become too great is defined by the equipment manufacturer by means of a boundary value, beyond which the deviation from the gradient linearity no longer acceptable. This advantageously requires no additional computing expense, because, in the image correction (equalization) of the basic exposure, the displacement has already been determined for each pixel, on the basis of the non-linearities of the gradient fields, which were measured precisely before the delivery of the apparatus.

Typically, the interior of the circle (the area that can usefully be used for the positioning) represents approximately 90 percent of the image surface. A significant incidence of error thus occurs outside the circular surface.

If the slice packet that is to be planned is oriented transversely to the z-axis (patient longitudinal axis, or axis in the direction of the patient table), an agreement of the planned slices with the actually measured slices can be increased according to the present invention by a displacement of the table, so that the slice packet is moved into the isocenter, that is, into the central area of the identified region. The isocenter is the area inside an MRT apparatus in which all the magnetic fields (basic field as well as all gradient fields) are decidedly linear. In general, for MRT exposures it is advantageous for the area to be recorded to be as close as possible to the isocenter. The inventive identification of the area with imprecise positioning gives the operator information concerning the topology of the intended measurement, and supports the operator in the measurement planning.

A further inventive approach to assist the operator in measurement planning based on corrected MRT overview images is, via the user interface, for the planned slice packets to be automatically also corrected during the correction of the overview image. This means that, according to FIG. 3C, the normally straight cross-section lines of the slice packet 24 must be presented in the form of curved lines. This approach has the advantage that the positioning of additional slices 24 that are to be measured can again take place on 100% of the image surface, but it presupposes a very good capacity for spatial imagination on the part of the operator, and is therefore an additional possibility for support in further measurement planning, but is not a practical alternative.

Although modifications and changes may be suggested by those skilled in the art, it is the intention of the inventors to embody within the patent warranted hereon all changes and modifications as reasonably and properly come within the scope of their contribution to the art.

We claim:

1. A processing system for a magnetic resonance tomography apparatus, said magnetic resonance tomography apparatus having a gradient coil system that generates magnetic gradients exhibiting non-linearities, said processing system comprising:

a display screen;

a processor connected to said display screen, said processor generating a user interface on said display screen allowing graphic scan planning based on a previously-obtained MRT overview image of a subject that was obtained using said gradient coil system and thus exhibits a distortion due to said non-linearities, said distortion in said overview image being corrected by said processor, using stored data accessible by said processor representing said non-linearities, to correct distortions in said overview image due to said non-linearities, thereby producing and displaying a corrected overview image; and said processor, in said user interface, graphically demarcating an area of said corrected overview image in which positioning of an additional, planned slice of the subject, from which MR data are to be acquired, will result, due to the distortion correction in said corrected overview image, result in said data being acquired from an actual slice of the subject that deviates from said planned slice, from an area of the corrected overview image in which positioning of said additional, planned, slice will not cause said planned slice to deviate from said actual slice.

2. A processing system as claimed in claim 1 wherein said MRT apparatus has an isocenter and has a displaceable support table adapted to receive the subject thereon to acquire said data, the subject having a subject axis, and wherein, if said additional, planned slice has a transverse orientation relative to said subject axis, said processor automatically calculates and generates control signals for supply to said support table to cause the support table to move the subject to bring the actual slice, corresponding to the planned slice, into the isocenter.

3. A processing system as claimed in claim 1 wherein said processor comprises a memory in which said stored data are stored, said stored data comprising data representing the non-linearities that were measured once before delivery of said MRT apparatus.

4. A processing system as claimed in claim 1 wherein said processor automatically generates said graphic demarcation.

5. A processing system for a magnetic resonance tomography apparatus, said magnetic resonance tomography apparatus having a gradient coil system that generates magnetic gradients exhibiting non-linearities, said processing system comprising:

a display screen;

a processor connected to said display screen, said processor generating a user interface on said display screen allowing graphic scan planning based on a previously-obtained MRT overview image of a subject that was obtained using said gradient coil system and thus exhibits a distortion due to said non-linearities, said distortion in said overview image being corrected by said processor, using stored data accessible by said processor representing said non-linearities, to correct distortions in said overview image due to said non-linearities, thereby producing and displaying a corrected overview image; and said processor, in correcting said overview image, also correcting a distortion due to said non-linearities in an additional, planned slice that is planned based on said overview image, thereby obtaining a distortion-corrected planned slice, and graphically displaying said distortion-corrected planned slice in the corrected overview image.

6. A processing system as claimed in claim 5 wherein said MRT apparatus has an isocenter and has a displaceable support table adapted to receive the subject thereon to acquire said data, the subject having a subject axis, and wherein, if said additional, planned slice has a transverse orientation relative to said subject axis, said processing system automatically calculates and generates control signals for supply to said support table to cause the support table to move the subject to bring the actual slice, corresponding to the planned slice, into the isocenter.

7. A processing system as claimed in claim 5 wherein said processor comprises a memory in which said stored data are stored, said stored data comprising data representing the non-linearities that were measured once before delivery of said MRT apparatus.

8. A method for operating a magnetic resonance tomography apparatus, said magnetic resonance tomography apparatus having a gradient coil system that generates magnetic gradients exhibiting non-linearities, a processor, and a display screen connected to the processor, said method comprising the steps of:

obtaining an MRT overview image of a subject using said gradient coil system, said overview image exhibiting a distortion due to said non-linearities;

correcting said overview image in said processor, using stored data accessible by said processor representing said non-linearities, to correct said distortion in said overview image due to said non-linearities, thereby producing a corrected overview image;

displaying said corrected overview image on said display screen in a user interface on said display screen allowing graphic scan planning based on said corrected overview image; and said processor, in said user interface, automatically graphically demarcating an area of said corrected overview image in which positioning of an additional, planned slice of the subject, from which MR data are to be acquired, will result, due to the distortion correction in said corrected overview image, in said data being acquired from an actual slice of the subject that deviates from said planned slice, from an area of the corrected overview image in which positioning of said additional, planned, slice will not cause said planned slice to deviate from said actual slice.

9. A method for operating a magnetic resonance tomography apparatus as claimed in claim 8 wherein said MRT apparatus has an isocenter and has a displaceable support table adapted to receive the subject thereon to acquire said data, the subject having a subject axis, and comprising the steps of, if said additional, planned slice has a transverse orientation relative to said subject axis, automatically calculating and generating control signals in said processor for supply to said support table to cause the support table to move the subject to bring the actual slice, corresponding to the planned slice, into the isocenter.

10. A method for operating a magnetic resonance tomography apparatus as claimed in claim 8 comprising measuring said stored data representing the non-linearities that once before delivery of said MRT apparatus.

11. A method for operating a magnetic resonance tomography apparatus as claimed in claim 8 comprising automatically generating said graphic demarcation.

12. A method for operating a magnetic resonance tomography apparatus, said magnetic resonance tomography apparatus having a gradient coil system that generates magnetic gradients exhibiting non-linearities, a processor, and a display screen connected to the processor, said method comprising the steps of:

obtaining an MRT overview image of a subject, said overview image exhibiting a distortion due to said non-linearities;

correcting said overview image in said processor, using stored data accessible by said processor representing said non-linearities, to correct said distortion in said overview image due to said non-linearities, thereby producing a corrected overview image;

displaying said corrected overview image on said display screen in a user interface on said display screen allowing graphic scan planning based on said corrected overview image; and said processor, in correcting said overview image, also correcting a distortion due to said non-linearities in an additional, planned slice, planned based on said corrected overview image, thereby obtaining a distortion-corrected slice, and graphically displaying said distortion-corrected slice in the corrected overview image.

13. A method for operating a magnetic resonance tomography apparatus, as claimed in claim 12 wherein said MRT apparatus has an isocenter and has a displacement support table adapted to receive the subject thereon to acquire said data, the subject having a subject axis, and comprising the steps of, if said additional, planned slice has a transverse orientation relative to said subject axis, automatically calculating and generating control signals in said processor for supply to said support table to cause the support table to move the subject to bring the actual slice, corresponding to the planned slice, into the isocenter.

14. A method for operating a magnetic resonance tomography apparatus, as claimed in claim 12 comprising measuring said data representing the non-linearities once before delivery of said MRT apparatus.

15. A method for operating a magnetic resonance tomography apparatus, as claimed in claim 12 comprising automatically generating said graphic demarcation in said processor.

\* \* \* \* \*